United States Patent
Delbecq et al.

(10) Patent No.: US 8,183,941 B2
(45) Date of Patent: May 22, 2012

(54) ELECTRONIC DEVICE FOR GENERATING A LOCAL OSCILLATOR SIGNAL HAVING A FREQUENCY EQUAL TO A FRACTIONAL PART OF A FUNDAMENTAL FREQUENCY

(75) Inventors: Dominique Delbecq, Bieville-Beuville (FR); Michel Germe, Caen (FR)

(73) Assignee: Koninklijke Philips Electronics N.V., Eindhoven (NL)

( * ) Notice: Subject to any disclaimer, the term of this patent is extended or adjusted under 35 U.S.C. 154(b) by 620 days.

(21) Appl. No.: 11/908,111

(22) PCT Filed: Mar. 1, 2006

(86) PCT No.: PCT/IB2006/050642
§ 371 (c)(1),
(2), (4) Date: Nov. 3, 2009

(87) PCT Pub. No.: WO2006/095283
PCT Pub. Date: Sep. 14, 2006

(65) Prior Publication Data
US 2010/0039184 A1    Feb. 18, 2010

(30) Foreign Application Priority Data
Mar. 8, 2005    (EP) .................................... 05300171

(51) Int. Cl.
*H04B 1/26*    (2006.01)

(52) U.S. Cl. .......................................... 331/77; 455/313
(58) Field of Classification Search ................. 331/74, 331/77; 455/313
See application file for complete search history.

(56) References Cited

U.S. PATENT DOCUMENTS
7,432,769 B2 * 10/2008 Kato et al. ..................... 331/74
2002/0081983 A1 * 6/2002 Brunel et al. ................. 455/130

FOREIGN PATENT DOCUMENTS
WO    WO2005107059    * 11/2005

* cited by examiner

*Primary Examiner* — James E Goodley
(74) *Attorney, Agent, or Firm* — Ladas & Parry, LLP

(57) ABSTRACT

An electronic device (ED) is intended for generating a local oscillator signal having a chosen frequency $F_{LO}$ from a main signal outputted by a voltage-controlled oscillator (VCO) and having a fundamental frequency $F_{VCO}$ and harmonics thereof. This electronic device (ED) comprises a frequency division means (D1, D2) arranged to divide the frequency of a signal by a chosen factor N and a filter means (F1, F2) arranged to select a chosen Mth order harmonic of a signal, these frequency division means (D1, D2; D) and filter means (F1, F2) being arranged to process the main signal in common to output the local oscillator signal with a chosen frequency $F_{LO}$ equal to $MxF_{VCO}/N$.

14 Claims, 1 Drawing Sheet

Figure 1:
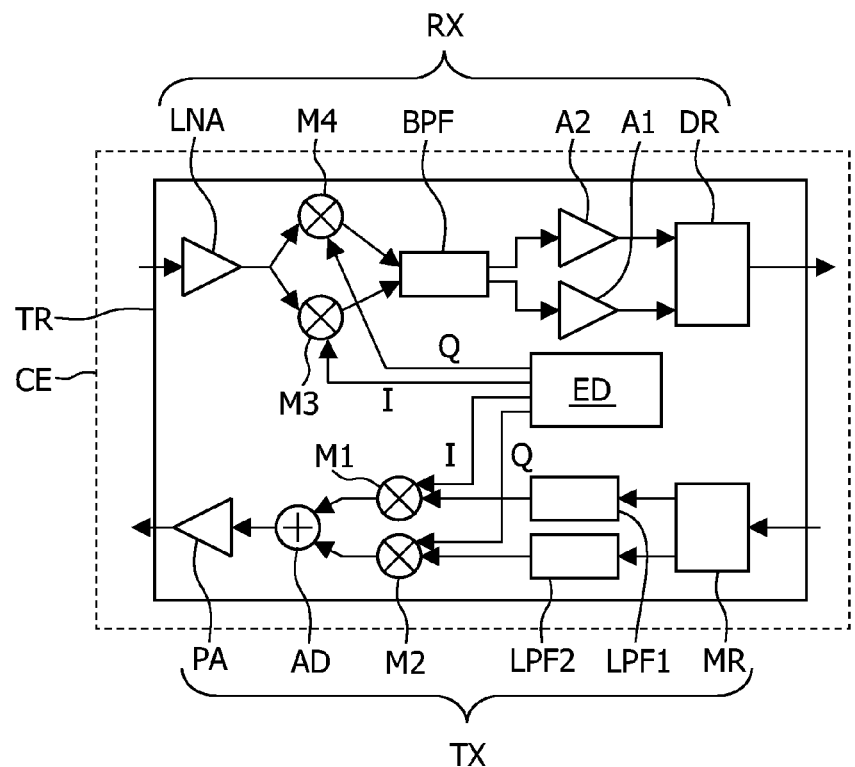

ELECTRONIC DEVICE FOR GENERATING A LOCAL OSCILLATOR SIGNAL HAVING A FREQUENCY EQUAL TO A FRACTIONAL PART OF A FUNDAMENTAL FREQUENCY

The present invention relates to the domain of communication equipments, and more precisely to the generation of a local oscillator signal intended for a transmitter or a transceiver of communication equipment.

As it is known by one skilled in the art, a lot of transmitters and transceivers are driven by a local oscillator signal having a chosen frequency $F_{LO}$ generated by an electronic device. This electronic device generally comprises a voltage-controlled oscillator (VCO) outputting a (main) signal having a fundamental frequency $F_{VCO}$ from which it generates the local oscillator signal.

The fundamental frequency $F_{VCO}$ is generally equal to an integer multiple of $F_{LO}$ and then to the frequency of the modulated signal which is outputted by the transmitter or transceiver power amplifier or to a chosen harmonic thereof. With such an arrangement the power amplifier pulls the VCO and then disturbs the output spectrum (through the generation of many harmonics).

In order to improve the situation it has been proposed to use an electronic device comprising a VCO with a fundamental frequency $F_{VCO}$ equal to 1.5 $F_{LO}$. Such a solution is notably disclosed in the document by H. Darabi et al "2.4-GHz CMOS Transceiver for Bluetooth", IEEE Journal of solid-state circuits, p.2016-2024, Vol.36, N°12, December 2001. In order to generate the chosen frequency $F_{LO}$ the disclosed electronic device comprises mixers which introduce a lot of harmonics and harmonic recombinations. To suppress these harmonics and harmonic recombinations one must use internal or external filters which are expensive. Moreover the mixers consume a lot of power, which restricts the application of this solution.

So, the object of this invention is to improve the situation.

For this purpose, the invention provides an electronic device intended for generating a local oscillator signal having a chosen frequency $F_{LO}$ from a main signal outputted by a voltage-controlled oscillator and having a fundamental frequency $F_{VCO}$ and harmonics thereof. This electronic device is characterized in that it comprises a frequency division means for dividing the frequency of a signal by a chosen factor N and a filter means for selecting a chosen Mth order harmonic of a signal, these frequency division means and filter means being arranged to process the main signal in common to output the local oscillator signal with a chosen frequency $F_{LO}$ equal to $M \times F_{VCO}/N$.

The electronic device according to the invention may have additional characteristics considered separately or combined, and notably:

- its frequency division means may comprise a first frequency divider for dividing the fundamental frequency $F_{VCO}$ by a factor N1 (with N1=N/N2 and for instance N1=2″) in order to output a first intermediate signal having a first intermediate frequency equal to $F_{VCO}/N1$ and harmonics thereof;
  - ➢ its filter means may comprise a band-cut filter for suppressing the frequencies of the first intermediate signal which are lying in a band extending up to the lower frequency of the Mth order harmonic of the first intermediate signal, in order to output a second intermediate signal;
  - its filter means may also comprise a band-pass filter arranged to pass the frequencies of the second intermediate signal which are lying in a band centred on a second intermediate frequency (equal to the middle frequency of the Mth order harmonic of the first intermediate signal), in order to output a third intermediate signal;
  - ❖ its frequency division means may also comprise a second frequency divider for dividing the frequency of the third intermediate signal by a factor N2 (with N2=N/N1 and for instance N2=2″), in order to output the local oscillator signal with the chosen frequency $F_{LO}$;
- in a variant its filter means may comprise a band-cut filter arranged to suppress frequencies of the main signal which are lying in a band extending up to the lower frequency of its Mth order harmonic, in order to output a first intermediate signal;
  - ➢ its filter means may comprise a band-pass filter arranged to let pass the frequencies of the first intermediate signal which are lying in a band centred on a first intermediate frequency (equal to the middle frequency of the Mth order harmonic of the main signal), in order to output a second intermediate signal;
  - its frequency division means may be arranged to divide the frequency of the second intermediate signal by N to output the local oscillator signal with the chosen frequency $F_{LO}$;
- it may also comprise an amplification means inserted between the band-cut filter and the band-pass filter and arranged to amplify the first or second intermediate signal;
- the voltage-controlled oscillator may generate a main signal having a square shape;
- M may be chosen in a group comprising integers 3, 5 and 7. For instance M is equal to 3;
- N may be chosen in a group comprising integers 2, 4 and 8. For instance N is equal to 4;
- it may constitute at least a part of an integrated circuit (IC).

The invention also provides a transceiver for communication equipment, comprising a transmitter circuit, a receiver circuit, and an electronic device such as the one introduced above.

Figure 2:
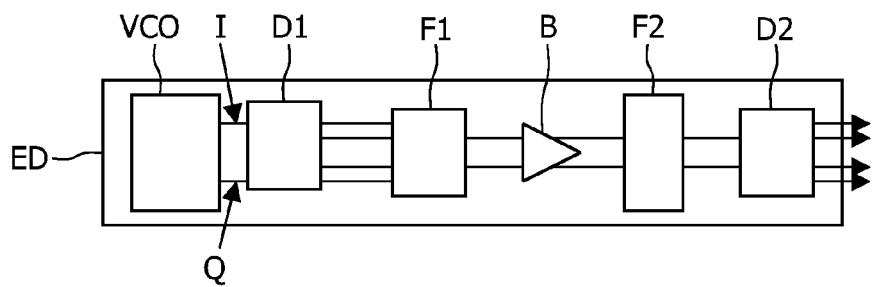
Figure 3:
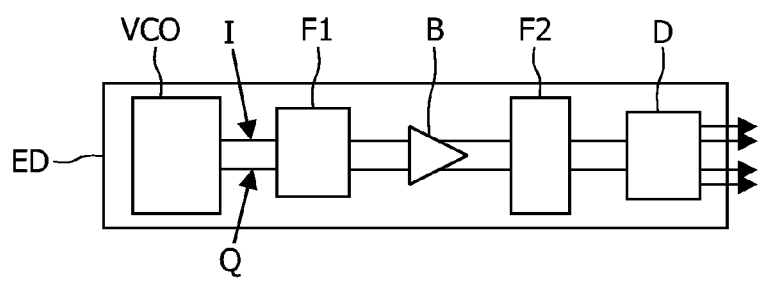

Other features and advantages of the invention will become apparent on examining the detailed specifications hereafter and the appended drawings, wherein:

FIG. 1 schematically illustrates communication equipment comprising a transceiver provided with an electronic device according to the invention, FIG. 2 schematically illustrates a first example of embodiment of an electronic device according to the invention, and FIG. 3 schematically illustrates a second example of embodiment of an electronic device according to the invention.

The appended drawings may not only serve to complete the invention, but also to contribute to its definition, if need be.

Reference is initially made to FIG. 1 to describe an example of transceiver TR in which the invention may be applied.

In the following description it will be considered that the transceiver TR is intended for communication equipment CE such as a mobile phone, for instance a GSM/GPRS or UMTS mobile phone. But it is important to noce that the invention is not limited to this type of communication equipment.

Indeed the invention may apply to any communication equipment or module, mobile (or not), and notably to a personal digital assistant (PDA) or a laptop comprising a communication module adapted to establish radio communications.

The invention does not only apply to transceivers. It also applies to transmitter circuits equipping any type of communication equipment or communication module.

As illustrated in FIG. 1, a transceiver TR comprises a transmitter (circuit) TX and a receiver (circuit) RX both driven by a local oscillator signal outputted by an electronic device ED.

For instance, the transmitter TX comprises:
- an I/Q modulator MR fed by a baseband processor (not illustrated), and comprising a first output for outputting I modulated signals and a second output for outputting Q modulated signals,
- first LPF1 and second LPF2 low-pass filters respectively fed with the I and Q modulated signals and respectively delivering I and Q filtered modulated signals,
- a first mixer M1 for mixing the I filtered modulated signals with a positive (or negative) I local oscillator signal outputted by the electronic device ED and having a frequency $F_{LO}$,
- a second mixer M2 for mixing the Q filtered modulated signals with a positive (or negative) Q local oscillator signal outputted by the electronic device ED and having a frequency $F_{LO}$,
- an adder AD for adding the I and Q signals outputted by the first M1 and second M2 mixers, and
- a power amplifier PA for amplifying the signals outputted by the adder AD and feeding an antenna (not illustrated).

The first M1 and second M2 mixers may be of any type, and for instance Gilbert type mixers.

For instance, the receiver RX comprises:
- a low-noise amplifier LNA receiving signals from the antenna and outputting I and Q modulated amplified signals,
- a first mixer M3 for mixing the I modulated signals with a negative (or positive) I local oscillator signal outputted by the electronic device ED and having a frequency $F_{LO}$,
- a second mixer M4 for mixing the Q modulated signals with a negative (or positive) Q local oscillator signal outputted by the electronic device ED and having a frequency $F_{LO}$,
- a band-pass filter BPF fed with the I and Q modulated signals mixed by the first M3 and second M4 mixers and delivering I and Q filtered modulated signals,
- first A1 and second A2 amplifiers respectively fed with the I and Q filtered modulated signals and respectively delivering I and Q amplified filtered modulated signals, and
- an I/Q demodulator DR fed by the first A1 and second A2 amplifiers and feeding the baseband processor with demodulated signals.

Such a transceiver TR may be dedicated to Bluetooth communications in the ISM band (centred on 2.4 GHz), for instance. But it is important to note that the invention is not limited to this type of transceiver. It applies to any type of transceivers and notably to those intended for cellular application, DECT, BT, or United States standard.

The electronic device ED according to the invention comprises at least a voltage-controlled oscillator (VCO), a frequency division means and a filter means.

The voltage-controlled oscillator (VCO) is intended for generating a main signal having a fundamental frequency $F_{VCO}$. The frequency division means is intended for dividing the frequency of a signal by a chosen factor N. The filter means is intended for selecting a chosen Mth order harmonic of a signal.

The frequency division means and the filter means are arranged to process the main signal in common in order to output the local oscillator signal with a chosen frequency $F_{LO}$ equal to $M \times F_{VCO}/N$.

For instance the main signal has a square shape. Such a shape is advantageous because it offers very low even harmonics and high odd harmonics (for instance the third harmonic (M=3) is approximately −10 db below the first harmonic, and the fifth harmonic (M=5) is approximately −14 db below the first harmonic).

In this case, the order M of the selected harmonic may be equal to 3, or 5, or else 7, and/or the value of the dividing factor N may be equal to 4 or 8.

We will now refer to FIG. 2 to describe, in more detail, a first example of embodiment of an electronic device ED according to the invention.

In the first example illustrated in FIG. 2, the frequency division means comprises first D1 and second D2 frequency dividers, while the filter means comprises a band-cut filter F1 and a band-pass filter F2.

The first D1 and second D2 frequency dividers are respectively arranged to divide the frequency of the signal they receive by a factor equal to N1 or N2, so that their combination offers a frequency division by a factor $N=N1 \times N2$. For instance $N1=N2=2^n$, where n is an integer greater than 0 (n>0).

In this first example the first frequency divider D1 is fed by the VCO with the main (I/Q) signal(s). So it divides the fundamental frequency $F_{VCO}$ by N1 to output a first intermediate signal having a first intermediate frequency equal to $F_{VCO}/N1$ and harmonics thereof.

For instance N1 is equal to 2. In this case the first frequency divider D1 is a divider-by-2, which allows to generate differential output signals I and Q, with a 90° phase shift between them, from each input signal.

The band-cut filter F1 is fed with the (four) first intermediate signal(s). It is arranged to suppress the frequencies of the(se) (four) first intermediate signal(s) which are lying in a band extending up to the lower frequency of the Mth order harmonic of the first intermediate signal. In other words the band-cut filter F1 is arranged to suppress every harmonic of the first intermediate signal whose order is lower than the selected value of M, in order to output (two) second intermediate signal(s) with harmonics having orders greater than or equal to the selected M (essentially harmonic orders 3, 5 and 7 when the main signal is square).

For instance the width of the suppressed band is equal to 100 MHz ($F_{VCO}/N1 \pm 50$ MHz).

Moreover, the band-cut filter F1 may be a notch filter, for instance.

As illustrated, a buffer B, acting as a signal amplifier, may be inserted between the band-cut filter F1 and the band-pass filter F2. Thus the (two) second intermediate signal(s) may be amplified before being filtered by the band-pass filter F2. This buffer B may be a low-noise amplifier (LNA).

The band-pass filter F2 is arranged to let pass the frequencies of the (two) second intermediate signal(s) which may have been amplified by the buffer B and are lying in a band centred on a second intermediate frequency which is equal to the middle (or center) frequency of the Mth order harmonic of the first intermediate signal. This second intermediate frequency is the frequency of the single harmonic which must be selected (order M>1). Therefore, the second intermediate frequency is equal to $M \times F_{VCO}/N1$.

For instance the band-pass filter F2 selects the third harmonic (M=3) from the (two) second intermediate signal(s), in order to output (two) third intermediate signal(s) having a second intermediate frequency equal to $3 \times F_{VCO}/N1$ ($3 \times F_{VCO}/2$ when N1=2).

For instance the width of the selected band is equal to 600 MHz ($M \times F_{VCO}/N2 \pm 300$ MHz).

Finally, in this first example the (two) third intermediate signal(s) feed the second frequency divider D2.

So the second frequency divider D2 divides the frequency $M \times F_{VCO}/N1$ of each third intermediate signal by N2 to output (four) local oscillator signal(s) having the chosen frequency $F_{LO}$ equal to $M \times F_{VCO}/N$ (with $N=N1 \times N2$).

When N2 is equal to 2 the second frequency divider D2 is also a divider-by-2, which allows to generate from each input signal differential output signals I and Q, with a phase shift of 90° between them.

For instance, when M is equal to 3 and N is equal to 4 (N1=N2=2) the chosen frequency $F_{LO}$ of the local oscillator signal is equal to $3 \times F_{VCO}/4$. In other words the electronic device ED uses a voltage-controlled oscillator (VCO) which generates a main signal having a fundamental frequency $F_{VCO}$ equal to $4F_{LO}/3$. In the case where the transceiver TR is dedicated to Bluetooth communications in the ISM band (centred on $F_{LO}=2.4$ GHz), the fundamental frequency $F_{VCO}$ must be equal to 3.2 GHz. In this case, the first and second intermediate frequencies are equal to 1.6 GHz and the third intermediate frequency is equal to 4.8 GHz.

We will now refer to FIG. 3 to describe in more detail a second example of embodiment of an electronic device ED according to the invention. This second example being a variant of the first example, it comprises several components functionally identical with components of the first example.

In the second example illustrated in FIG. 3, the filter means still comprises the band-cut filter F1 and the band-pass filter F2, but the frequency division means only comprises one frequency divider D (or two frequency dividers mounted in series).

The band-cut filter F1 is fed by the VCO with the (two) main I/Q signal(s). It is arranged to suppress the frequencies of the (two) main I/Q signal(s), which are lying in a band extending up to the lower frequency of its Mth order harmonic. In other words the band-cut filter F1 is arranged to suppress every harmonic of the (two) main I/Q signal(s) whose order is lower than the selected value of M, in order to output (two) first intermediate signal(s) with harmonics having orders greater than or equal to the selected M (essentially harmonic orders 3, 5 and 7 when the main I/Q signal is square).

For instance the width of the suppressed band is equal to 100 MHz ($F_{VCO} \pm 50$ MHz).

As in the first example the band-cut filter F1 may be a notch filter.

Moreover, as in the first example, a buffer B, acting as a signal amplifier, may be inserted between the band-cut filter F1 and the band-pass filter F2. Thus the (two) first intermediate signal(s) may be amplified before being filtered by the band-pass filter F2. This buffer B may be a low-noise amplifier (LNA).

The band-pass filter F2 is arranged to let pass the frequencies of the (two) first intermediate signal(s) which may have been amplified by the buffer B and are lying in a band centred on a second intermediate frequency which is equal to the middle (or centre) frequency of the Mth order harmonic of the main (I/Q) signal(s). This second intermediate frequency is the frequency of the single harmonic which must be selected (order M>1). Therefore the second intermediate frequency is equal to $M \times F_{VCO}$.

For instance the band-pass filter F2 selects the third harmonic (M=3) from the (two) first intermediate signal(s), in order to output (two) second intermediate signal(s) having a second intermediate frequency equal to $3 \times F_{VCO}$.

For instance the width of the selected band is equal to 600 MHz ($M \times F_{VCO} \pm 300$ MHz).

Finally, in this second example the (two) second intermediate signal(s) feed the frequency divider D.

So the frequency divider D divides the frequency $M \times F_{VCO}$ of each third intermediate signal by N to output (four) local oscillator signal(s) having the chosen frequency $F_{LO}$ equal to $M \times F_{VCO}/N$.

When N is equal to 4 the frequency divider D is a divider-by-4, which allows to generate from each input signal differential output signals I and Q, with a 90° phase shift between them.

For instance, when M is equal to 3 and N is equal to 4 the chosen frequency $F_{LO}$ of the local oscillator signal is equal to $3 \times F_{VCO}/4$. In other words the electronic device ED uses a voltage-controlled oscillator (VCO) which generates a main signal having a fundamental frequency $F_{VCO}$ equal to $4F_{LO}/3$.

In the case where the transceiver TR is dedicated to Bluetooth communications in the ISM band (centred on $F_{LO}=2.4$ GHz), the fundamental frequency $F_{VCO}$ must be equal to 3.2 GHz. In this case, the second intermediate frequency is equal to 9.6 GHz (at the output of the band-pass filter F2).

Preferably, the electronic device ED, according to the invention, constitutes at least a part of an integrated circuit (IC), which may be realized in CMOS technology or in any technology used in chip manufacturing, such as the BICMOS technology or the bipolar technology, for instance.

The invention is not limited to the embodiments of electronic device, transceiver and communication equipment described above, only as examples, but it encompasses all alternative embodiments which may be considered by one skilled in the art to be within the scope of the claims hereafter.

Thus, in the above description there have been disclosed two examples of embodiment of an electronic device in which the chosen frequency $F_{LO}$ of the outputted local oscillator signal(s) is equal to $3 \times F_{VCO}/4$. But the invention is not limited to this fractional relationship between $F_{LO}$ and $F_{VCO}$ (fundamental frequency of the VCO). Indeed the invention may apply to any fractional relationship between $F_{LO}$ and $F_{VCO}$ verifying $M \times F_{VCO}/N$, where M is the order of the selected harmonic and N is a dividing factor. For instance, $F_{LO}$ may be equal to $3 \times F_{VCO}/2$ or $3 \times F_{VCO}/4$ or else $3 \times F_{VCO}/8$ (for instance when N1=2 and N2=4), or $5 \times F_{VCO}/2$ or $5 \times F_{VCO}/4$ or else $5 \times F_{VCO}/8$.

The invention claimed is:

1. Electronic device for generating a local oscillator signal having a chosen frequency $F_{LO}$ from a main signal outputted by a voltage-controlled oscillator and having a fundamental frequency $F_{VCO}$ and harmonics thereof, characterized in that said electronic device comprises a frequency division means arranged to divide the frequency of a signal by a chosen factor N and a filter means arranged to select a chosen Mth order harmonic of a signal, said frequency division means and filter means being arranged to process said main signal in common to output said local oscillator signal with a chosen frequency $F_{LO}$ equal to $M \times F_{VCO}/N$;

wherein said filter means comprises a first band-cut filter arranged to suppress frequencies of said main signal which are lying in a band extending up to the lower frequency of its Mth order harmonic, in order to output a first intermediate signal; and said filter means comprises a first band-pass filter arranged to pass frequencies of said first intermediate signal which are lying in a band centered on a first intermediate frequency, equal to the middle frequency of the Mth order harmonic of said main signal, in order to output a second intermediate signal.

2. Electronic device according to claim 1, characterized in that said frequency division means comprises a first frequency divider arranged to divide said fundamental frequency $F_{VCO}$ by a factor N1, with N=N1×N2, and to output the first intermediate signal having a first intermediate frequency equal to $F_{VCO}$/N1 and harmonics thereof.

3. Electronic device according to claim 2, characterized in that said filter means comprises a second band-cut filter arranged to suppress frequencies of said first intermediate signal which are lying in a band extending up to the lower frequency of the Mth order harmonic of said first intermediate signal, in order to output a third intermediate signal.

4. Electronic device according to claim 3, characterized in that said filter means comprises a third band-pass filter arranged to pass frequencies of said third intermediate signal which are lying in a band centered on a second intermediate frequency, equal to the middle frequency of the Mth order harmonic of said first intermediate signal, in order to output a fourth intermediate signal.

5. Electronic device according to claim 4, characterized in that said frequency division means comprises a second frequency divider arranged to divide the frequency of said fourth intermediate signal by a factor N2, with N=N1×N2, to output said local oscillator signal with said chosen frequency $F_{LO}$.

6. Electronic device according to claim 1, characterized in that said frequency division means is arranged to divide the frequency of said second intermediate signal by N to output said local oscillator signal with said chosen frequency $F_{LO}$.

7. Electronic device according to claim 3, characterized in that said electronic device also comprises an amplification means inserted between said second band-cut filter and said first band-pass filter and arranged to amplify said first or third intermediate signal.

8. Electronic device according to claim 1, characterized in that said voltage-controlled oscillator is arranged to generate a main signal having a square shape.

9. Electronic device according to claim 1, characterized in that M is chosen in a group comprising integers 3, 5 and 7.

10. Electronic device according to claim 9, characterized in that M is equal to 3.

11. Electronic device according to claim 1, characterized in that N is chosen in a group comprising integers 2, 4 and 8.

12. Electronic device according to claim 11, characterized in that N is equal to 4.

13. Electronic device according to claim 1, characterized in that it constitutes at least a part of an integrated circuit.

14. Transceiver for communication equipment comprising a transmitter circuit and a receiver circuit, intended for driving said transmitter circuit and said receiver circuit, characterized in that it comprises an electronic device for generating a local oscillator signal having a chosen frequency $F_{LO}$ from a main signal outputted by a voltage-controlled oscillator and having a fundamental frequency $F_{VCO}$ and harmonics thereof, characterized in that said electronic device comprises a frequency division means arranged to divide the frequency of a signal by a chosen factor N and a filter means arranged to select a chosen Mth order harmonic of a signal, said frequency division means and filter means being arranged to process said main signal in common to output said local oscillator signal with a chosen frequency $F_{LO}$ equal to $M \times F_{VCO}/N$;

wherein said filter means comprises a band-cut filter arranged to suppress frequencies of said main signal which are lying in a band extending up to the lower frequency of its Mth order harmonic, in order to output a first intermediate signal; and wherein said filter means comprises a band-pass filter arranged to pass frequencies of said first intermediate signal which are lying in a band centered on a first intermediate frequency, equal to the middle frequency of the Mth order harmonic of said main signal, in order to output a second intermediate signal.

* * * * *